United States Patent
Gonzalez et al.

(10) Patent No.: US 7,602,635 B2
(45) Date of Patent: *Oct. 13, 2009

(54) STRUCTURE FOR A CONFIGURABLE SRAM SYSTEM AND METHOD

(75) Inventors: Christopher J. Gonzalez, Shelburne, VT (US); Vinod Ramadurai, S. Burlington, VT (US); Norman J. Rohrer, Underhill, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/947,092

(22) Filed: Nov. 29, 2007

(65) Prior Publication Data
US 2009/0141536 A1     Jun. 4, 2009

(51) Int. Cl.
*G11C 11/00*     (2006.01)
(52) U.S. Cl. .................. 365/154; 365/156; 365/49; 365/189.04
(58) Field of Classification Search ............... 365/154, 365/156, 49, 189.04
See application file for complete search history.

(56) References Cited

U.S. PATENT DOCUMENTS

| | | | |
|---|---|---|---|
| 4,873,665 A | 10/1989 | Jiang et al. | |
| 5,532,957 A | 7/1996 | Malhi | |
| 5,610,862 A | 3/1997 | Teel | |
| 6,104,211 A | 8/2000 | Alfke | |
| 7,158,403 B2 * | 1/2007 | Schmitt | 365/154 |
| 7,304,874 B2 * | 12/2007 | Venkatraman et al. | 365/49.1 |
| 7,466,582 B2 * | 12/2008 | Fifield et al. | 365/154 |

OTHER PUBLICATIONS

First Office Action dated May 13, 2008 regarding related U.S. Appl. No. 11/463,917.
Response to First Office Action dated Jun. 4, 2008 regarding related U.S. Appl. No. 11/463,917.
Notice of Allowance dated Jul. 3, 2008 regarding related U.S. Appl. No. 11/463,917.
U.S. Appl. No. 11/463,917 filed Aug. 11, 2006 entitled "Configurable SRAM System and Method," Christopher J. Gonzalez, Vinod Ramadurai, Norman J. Rohrer.

* cited by examiner

*Primary Examiner*—Connie C Yoha
(74) *Attorney, Agent, or Firm*—David Cain

(57) ABSTRACT

A design structure for a static random access memory (SRAM) circuit includes first SRAM cell and a second SRAM cell that are configured to operate in a shared mode and/or an independent mode. In one example, a shared mode includes the sharing of a memory node of a first SRAM cell. In another example, an independent mode includes isolating a first SRAM cell from a second SRAM cell such that they operate independently.

6 Claims, 5 Drawing Sheets

STRUCTURE FOR A CONFIGURABLE SRAM SYSTEM AND METHOD

FIELD OF THE INVENTION

The present invention generally relates to the field of static random access memory (SRAM) cells. In particular, the present invention is directed to a design structure for a configurable SRAM system and method.

BACKGROUND

Static random access memory (SRAM) cells are susceptible to process and environmental variation. Such variation has become a greater concern as cell dimensions have become smaller. One example variation includes asymmetry in the cell, which may impact the ability to properly write or read an SRAM cell. Device asymmetry can be an even larger problem as the voltages provided to a cell are lowered.

SUMMARY OF THE DISCLOSURE

In one implementation, a design structure embodied in a machine readable medium used in a design process for a static random access memory (SRAM) circuit is provided. The design structure for the circuit includes a first SRAM cell having a first memory node and a second memory node; a second SRAM cell having a third memory node and a fourth memory node; a first cell control module connected between the first memory node and the third memory node; and a second cell control module connected between the second memory node and the fourth memory node, the first and second cell control modules configured to switch between a first mode of operation where the memory nodes of the first SRAM and the second SRAM are isolated and a second mode of operation where the first and third memory nodes are shared and the second and fourth memory nodes are shared.

In another implementation, a design structure embodied in a machine readable medium for a static random access memory (SRAM) circuit is provided. The design structure for the circuit includes a first SRAM cell having a first plurality of memory nodes, the first SRAM cell coupled to a first bitline, a second bitline, and a first wordline; a second SRAM cell having a second plurality of memory nodes, the second SRAM cell being coupled to the first and second bitlines and a second wordline; and a pair of cell isolation devices connected between the first and second pluralities of memory nodes for switching between a first mode of operation where the first and second SRAM cells are combined to form a shared SRAM cell and a second mode of operation where the first and second SRAM cells are isolated from each other.

BRIEF DESCRIPTION OF THE DRAWINGS

For the purpose of illustrating the invention, the drawings show aspects of one or more embodiments of the invention. However, it should be understood that the present invention is not limited to the precise arrangements and instrumentalities shown in the drawings, wherein.

DETAILED DESCRIPTION

Figure 1:
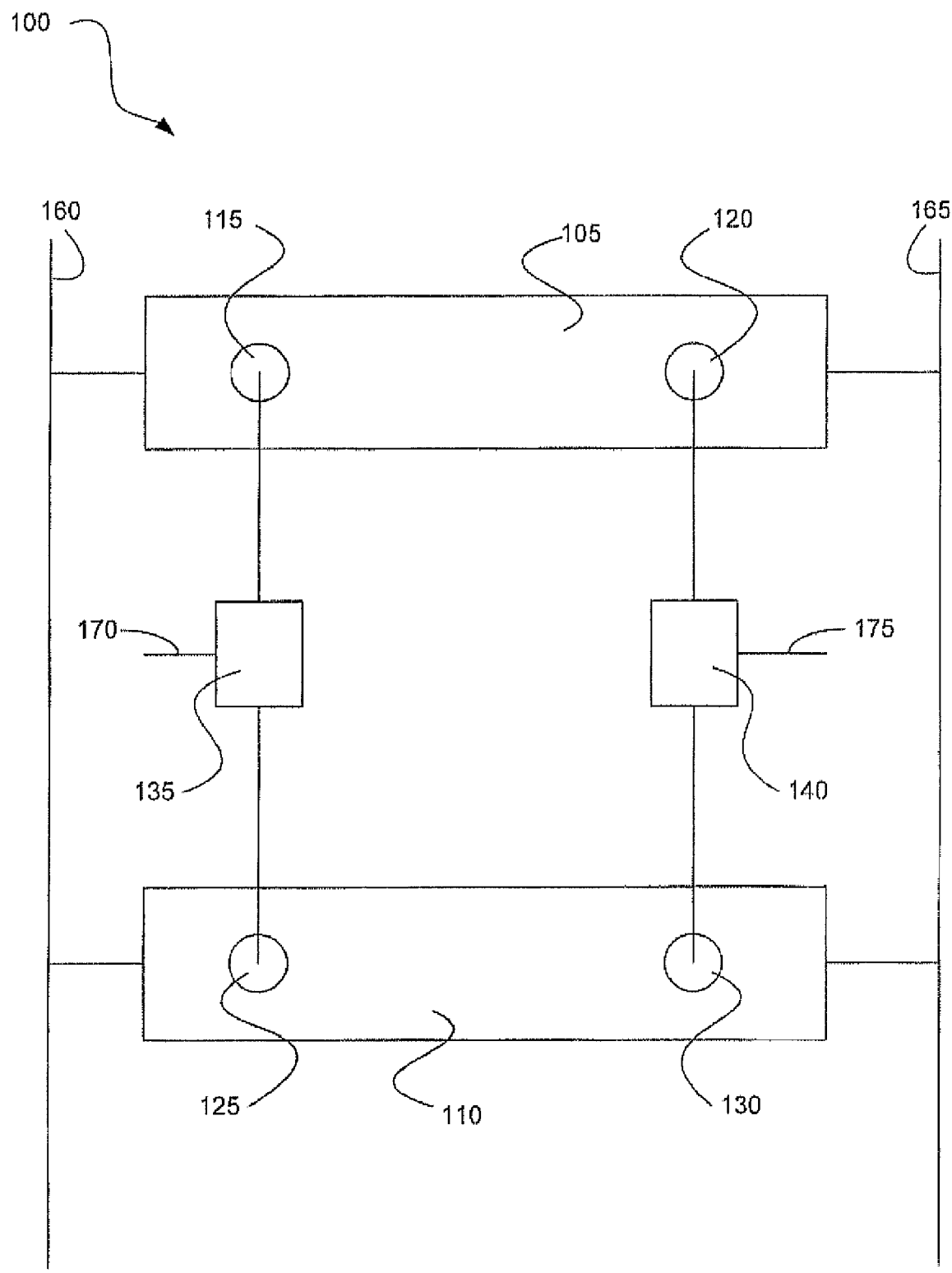
FIG. 1 shows one embodiment of an SRAM system.

The present invention is directed to a design structure for a configurable SRAM system and method. FIG. 1 illustrates one embodiment of an SRAM system 100. SRAM system 100 includes an SRAM cell 105 and an SRAM cell 110. SRAM cell 105 includes a first memory node 115 (i.e., a memory storage node) and a second memory node 120. SRAM cell 110 includes a first memory node 125 and a second memory node 130.

Figure 2:
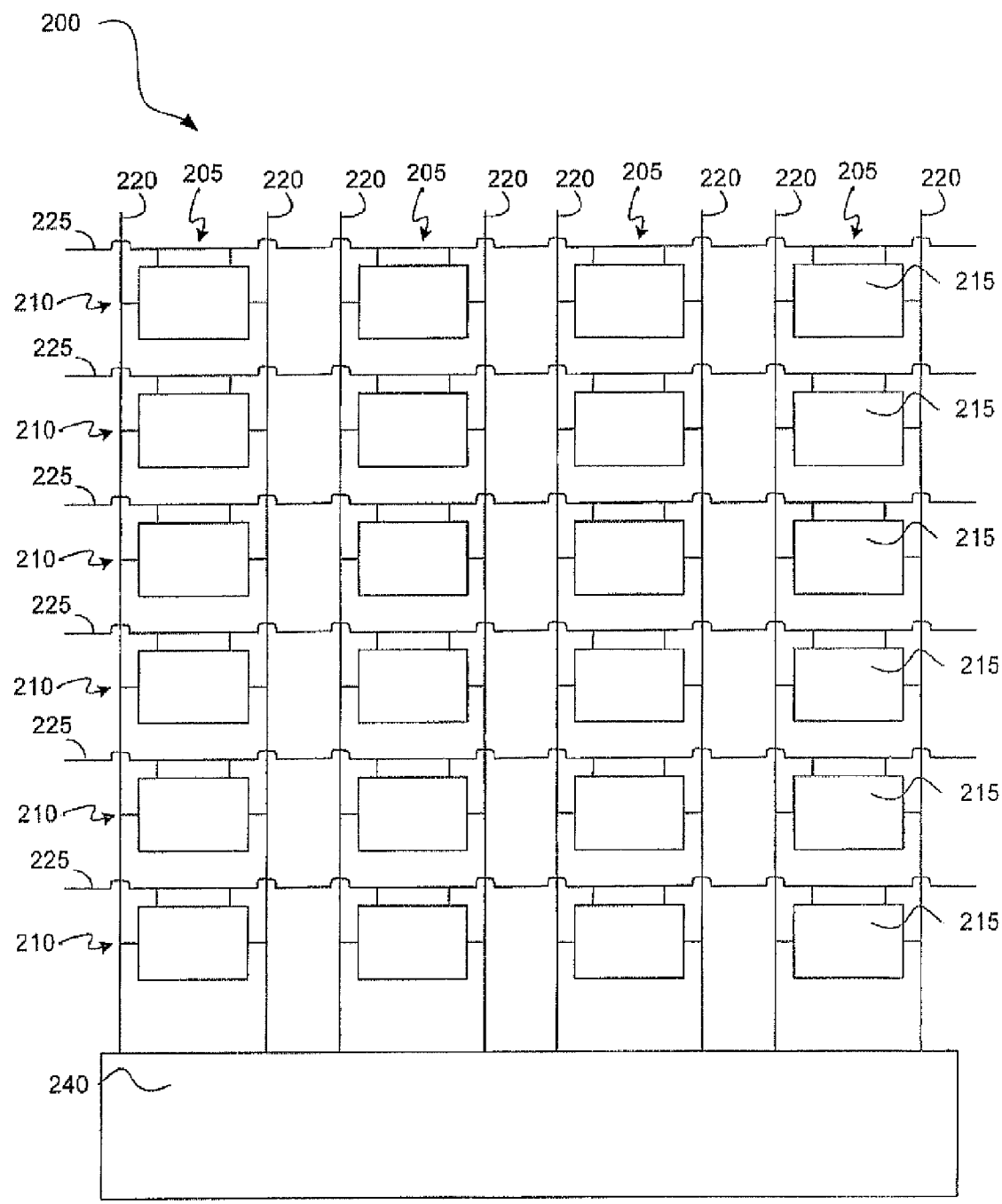
FIG. 2 shows one example of a grid arrangement of SRAM cells.

SRAM system 100 may be included in a memory array of a number of SRAM cells arranged in one of many well known arrangements. In one example, SRAM cells (e.g., SRAM cells 105, 110) may be arranged in a grid pattern having columns and rows. Examples of such a grid pattern are well known to those of ordinary skill. FIG. 2 illustrates one example of a grid pattern arrangement 200 of SRAM cells. Grid pattern arrangement 200 includes columns 205 and rows 210. Each column 205 includes a plurality of SRAM cells 215 connected with each other by bitlines 220. Each row 210 includes at least one wordline 225 connected with at least a portion of each of the plurality of SRAM cells 215 in the corresponding row. In one example, to read and/or write data to/from SRAM cells in a given row, a wordline 225 corresponding to a particular row will be utilized to allow electrical communication between memory cells of each SRAM cell 215 in the row with corresponding bitlines 220. Various activation sequences for wordlines, such as wordlines 225, are known to those of ordinary skill. A data collection unit 240 (e.g., a multiplexer) may be utilized to process information to and/or from bitlines 220. Typically, only one prior art SRAM cell from each column could be read and/or written to at a time utilizing the same bitlines. It should also be noted that although grid pattern arrangement 200 depicts four columns and six rows, one of ordinary skill will recognize that many configurations of rows and/or columns may be utilized in a grid pattern arrangement of SRAM cells.

Figure 3:
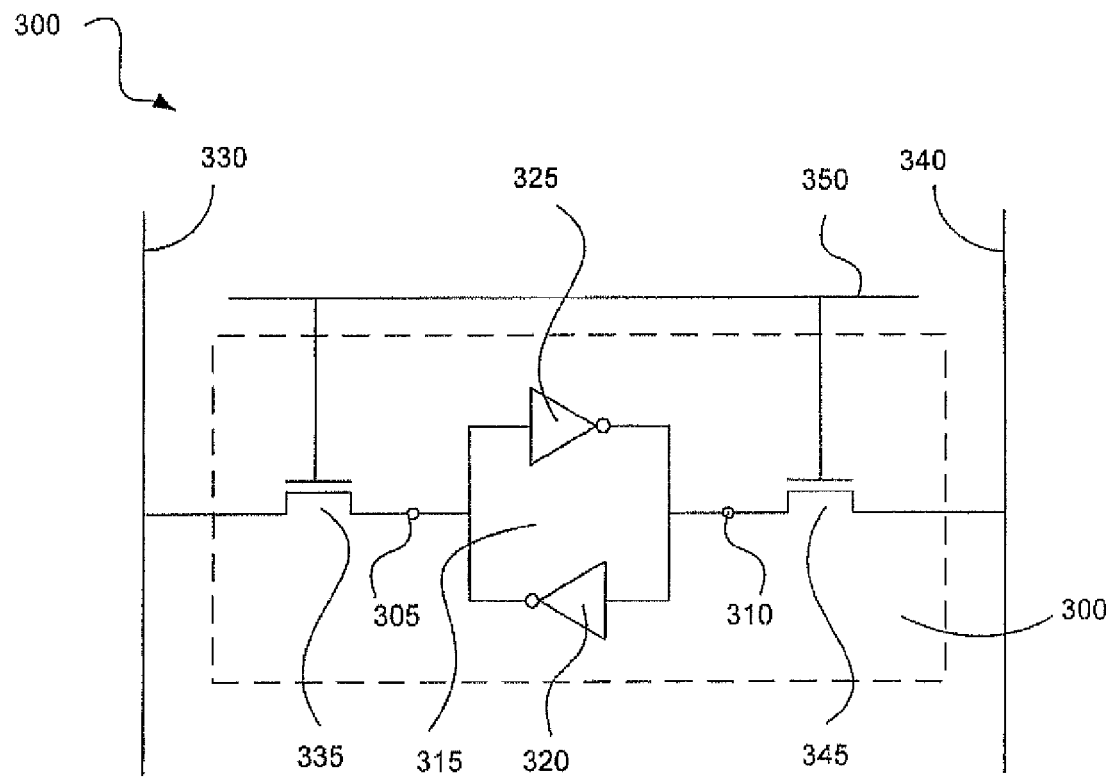
FIG. 3 shows one example of an SRAM cell.

Each of SRAM cells 105, 110 of FIG. 1 may include any well known SRAM cell. One example of an SRAM cell is a cross-coupled six transistor SRAM cell. FIG. 3 illustrates another example of an SRAM cell 300. SRAM cell 300 includes a memory node 305 and a memory node 310 separated by a feedback loop 315 (e.g., a cross-coupled inverter pair). Feedback loop 315 may include any number and/or combination of circuit elements as is known to those of ordinary skill. In one example, feedback loop 315 may include inverters 320 and 325 in parallel.

Memory node 305 is separated from a bitline 330 by an access transistor 335. Memory node 310 is separated from a bitline 340 by an access transistor 345. In one example, an access transistor (e.g., access transistor 335, access transistor 345) may include any number and/or combination of transistors. An example access transistor may include, but is not limited to, a p-type field effect transistor (FET), a n-type FET, a pass gate arrangement of two or more FET's, and any combinations thereof.

A wordline 350 is connected to access transistors 335, 345. In one example, a signal (e.g., a voltage drop, a voltage increase) on wordline 350 may operate to allow current to flow across access transistors 335, 345 to bring memory node 305 into electrical communication with bitline 330 and memory node 310 into electrical communication with bitline 340. In another example, wordline 350 may be activated during a read and/or write operation of SRAM cell 300.

Referring again to FIG. 1, SRAM cells 105 and 110 are illustrated in a column. SRAM cells 105 and 110 are in electrical communication with a bitline 160 and a bitline 165. In one example, bitlines 160 and 165 may be utilized to read and/or write information to and/or from a memory node (e.g., memory nodes 115, 120, 125, 130) of one or more of SRAM cells 105, 115. In another example, bitline 160 may be a "true" bitline and bitline 165 may be a "compliment" bitline.

First memory node 115 and first memory node 125 are connected with a cell control module 135. Second memory node 120 and second memory node 130 are connected with cell control module 140. In one example, a cell control module, such as cell control modules 135, 140, includes one or more circuit elements that are configured to switch between a logically inactive state and a logically active state upon receiving appropriate instruction (e.g., an activation signal, a deactivation signal) via a cell control switch mechanism. A cell control switch mechanism may include any mechanism (e.g., a signal from a controller or other processor) for switching a cell control module from one state to another, such as from a logically inactive state to a logically active state. In one example, cell control modules 135, 140 switch substantially simultaneously from one state to another. In another example, cell control modules 135, 140 are in electrical communication (e.g., the gates of cell control modules 135, 140 are connected to) a single cell control switch mechanism that switches cell control modules 135, 140 from a logically inactive state to a logically active state and/or from a logically active state to a logically inactive state. In yet another example, cell control modules 135, 140 each may be in electrical communication with a separate cell control switch mechanism where each of the separate cell control switch mechanisms work in concert to switch cell control modules 135, 140 between states.

Figure 4:
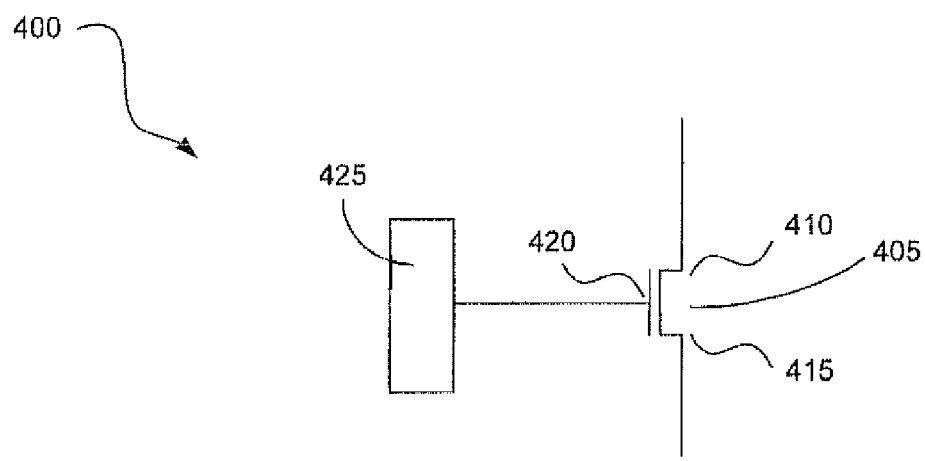
FIG. 4 shows one example of a cell control module.

FIG. 4 illustrates one example of a cell control module 400. Cell control module 400 includes an access transistor 405. In one example, access transistor 405 may include any number and/or combination of transistors. An example access transistor may include, but is not limited to, a p-type field effect transistor (FET), a n-type FET, a pass gate arrangement of two or more FET's, and any combinations thereof. In one example, a first node 410 of access transistor 405 (e.g., a source, a drain) is connected to a memory node of a first SRAM cell (e.g., memory node 115 of FIG. 1) and a second node 415 of access transistor 405 (e.g., a source, a drain) is connected to a memory node of a second SRAM cell (e.g., memory node 125 of FIG. 1). A gate 420 of access transistor 405 is connected to a cell control switch mechanism 425. In one example, access transistor 405 includes an n-type FET with a gate 420 connected to cell control switch mechanism 425, which drives a voltage at gate 420 high in order to switch access transistor 405 to a logically active state. In another example, access transistor 405 includes a p-type FET with a gate 420 connected to cell control switch mechanism 425, which drives a voltage at gate 420 low in order to switch access transistor 405 to a logically active state. In yet another example, access transistor 405 includes a p-type FET and an n-type FET in parallel, each having a gate 420 connected to cell control switch mechanism 425. Cell control switch mechanism 425 drives a voltage at gate 420 of the n-type FET high to switch the n-type FET to a logically active state and drives a voltage at gate 420 of the p-type FET low to switch the p-type FET to a logically active state. Such an example takes advantage of an n-type FET's ability to share a logical "1" between memory nodes (e.g., memory nodes 115 and 125, memory nodes 120 and 130) well, and a p-type FET's ability to share a logical "0" between memory nodes well.

Referring again to FIG. 1, cell control modules 135, 140, when in a logically inactive state, separate the memory nodes of SRAM cell 105 and SRAM cell 110. SRAM cell 105 and SRAM cell 110 act independently in the logically inactive state. In a logically active state, a cell control module (e.g., cell control modules 135, 140) allows current to pass across the cell control module. When cell control module 135 is in a logically active state, memory node 115 and memory node 125 are shared. When cell control module 140 is in a logically active state, memory node 120 and memory node 130 are shared.

Various mechanisms for controlling an activation/deactivation signal to a cell control module (e.g., cell control modules 135, 140) will be clear to those of ordinary skill. An example mechanism includes, but is not limited to, detection of system lowering voltage. The timing of switching a cell control module from a logically active to a logically inactive mode and/or from a logically inactive to a logically active mode will vary depending on device and/or application, as will the mechanism utilized to control the switching. Example mechanisms include, but are not limited to, a static logic circuit, a dynamic logic circuit, and any combinations thereof. In one example, cell control module 135 and cell control module 140 are switched to and/or from a logically active state substantially simultaneously. In another example, cell control modules 135, 140 may be switched to and/or from a logically active state at different times.

SRAM system 100 shows two SRAM cells (105, 110) being connected with cell control modules 135, 140. In another embodiment, three or more SRAM cells may be connected with one or more cell control modules. SRAM cells 105, 110 are shown in FIG. 1 as parallel to each other in a single column. In yet another embodiment, two or more SRAM cells (e.g., SRAM cells 105, 110) may be in separate columns.

Figure 5:
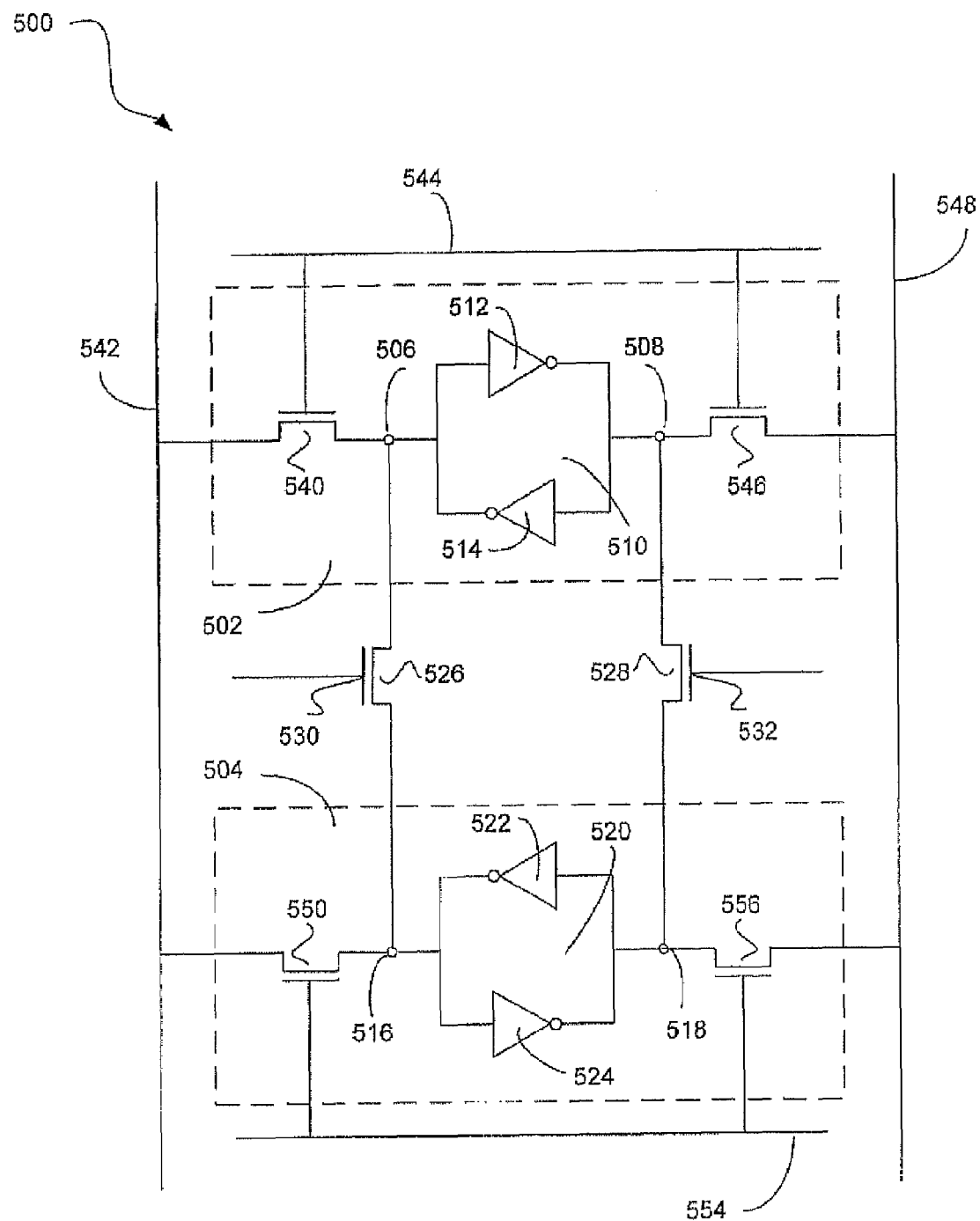
FIG. 5 shows another embodiment of an SRAM system.

FIG. 5 illustrates another embodiment of a SRAM system 500. SRAM system 500 includes an SRAM cell 502 and an SRAM cell 504. SRAM cell 502 includes memory nodes 506, 508 separated by a feedback loop 510. Feedback loop 510 includes inverters 512, 514. SRAM cell 504 includes memory nodes 516, 518 separated by a feedback loop 520. Feedback loop 520 includes inverters 522, 524. SRAM system 500 also includes a cell control module 526 connected between memory nodes 506 and 516 and a cell control module 528 connected between memory nodes 508 and 518. Each of cell control modules 526, 528 may include any number and any combination of transistors or other circuit elements that allow the cell control modules to be in a logically active state and a logically inactive state. In one example, cell control modules 526, 528 may be in a logically active state and allow sharing of logical values stored in the memory nodes (e.g., memory nodes 506/516 and 508/518). In such an example, SRAM cell 502 and SRAM cell 504 may combine to form one effective SRAM cell. In another example, cell control modules 526, 528 may be in a logically inactive state acting as isolation devices and not allow sharing of logical values stored in the memory nodes (e.g., memory nodes 506/516 and 508/518). In such an example, SRAM cell 502 and SRAM cell 504 act separately. The active and inactive states of cell control modules 526, 528 may be controlled by a cell control switch mechanism (not shown) connected via gates 530, 532 of cell control modules 526, 528.

SRAM cells 502 and 504 may be read from and/or written to simultaneously or separately depending on the active/inactive state of cell control modules 526, 528. SRAM cell 502 includes an access transistor 540 between memory node 506 and a bitline 542. Access transistor 540 is controlled by a wordline 544 connected to a gate of access transistor 540. SRAM cell 502 also includes an access transistor 546 between memory node 508 and a bitline 548. Access transistor 546 is also controlled by wordline 544 connected to a gate of access transistor 546. SRAM cell 504 includes an access transistor 550 between memory node 516 and bitline 542. Access transistor 550 is controlled by a wordline 554 connected to a gate of access transistor 550. SRAM cell 504 also includes an access transistor 556 between memory node 518 and bitline 548. Access transistor 556 is also controlled by wordline 554 connected to a gate of access transistor 556.

Each of access transistors 540, 546, 550, 556 may include any one or more transistors including, but is not limited to, a p-type field effect transistor (FET), a n-type FET, a pass gate arrangement of two or more FET's, and any combinations thereof.

A configurable SRAM system of the present disclosure (e.g., SRAM system 100, 500) may be included in a variety of devices. Example devices that may include a configurable SRAM system include, but are not limited to, a stand-alone SRAM (e.g., a 512 megabyte chip), a microprocessor, a microcontroller, any other integrated circuit capable of handling an embedded SRAM element and/or array, and any combinations thereof. In one example, SRAM system 100, 500 may be included in a grid arrangement similar to that of FIG. 2. In another example, SRAM system 100, 500 may be included in an array of SRAM systems 100, 500.

In one embodiment, a configurable SRAM system (e.g., SRAM system 100, 500) may be operated in one of two different operating modes: a shared mode (i.e., a process tolerant mode) and an independent mode (i.e., a high performance mode). In a shared mode, two or more SRAM cells are shared by switching corresponding cell control modules to a logically active state. In an independent mode, two or more SRAM cells are allowed to operate independently by switching corresponding cell control modules to a logically inactive state. In one example, a process tolerant mode that allows sharing of two or more SRAM cells may be instigated by low voltage operation of a device including an SRAM system according to the present disclosure. Upon return to a high voltage operation of the device, the SRAM system may switch to a high performance mode in which the cell control modules switch to a logically inactive state and allow the SRAM cells to operate independently. In one example, a memory device may have a maximum operating voltage and one or more lesser voltages at which it may operate (e.g., to save power) in different modes. The actual values of these voltages vary depending on device and application. In one example, a memory device having a maximum operating voltage of 1.2 volts (V) may also have a lower operating voltage of 0.8 V that is utilized in a power-saving mode.

One embodiment of a method of switching performance modes of an SRAM system will be described with reference to FIG. 5. One of ordinary skill will recognize that the method may be implemented with any configurable SRAM system according to the present disclosure. In one example, SRAM system 500 may begin operation in an independent mode with SRAM cell 502 and SRAM cell 504 working independently from each other and cell control modules 530, 532 in a logically inactive state. A read and/or write operation may be implemented on SRAM cell 502 independently from SRAM cell 504 by activating wordlines 544 and 554 independently. SRAM system 500 may be switched to a shared mode by sending a cell control signal to cell control modules 530, 532 to switch cell control modules to a logically active state. In the logically active state, memory node 506 shares with memory node 516 and memory node 508 shares with memory node 518. In a shared mode, a read and/or write operation may be implemented on a combined SRAM cell that includes SRAM cell 502 and SRAM cell 504. In one example, wordlines 544 and 554 may be activated together to allow logical values to pass between memory nodes 506, 508, 516, 518 and bitlines 542, 548. In one example, all SRAM cells in an array of SRAM system 500 SRAM cells may be switched from one mode to another simultaneously.

In another embodiment, logical values stored in memory nodes 506, 508, 516, 518 may be required to be saved for later use and/or invalidated when SRAM system 500 switches from one mode to another. In one example, one or more logical values stored in memory nodes 506, 508, 516, 518 may be cached in a system separate from SRAM system 500 according to well known memory caching mechanisms. In another example, a device including SRAM system 500 may be instructed to invalidate the memory cache of SRAM system 500 at or near the time of switching SRAM system 500 from one mode to another.

In one embodiment, an SRAM system according to the present disclosure allows two or more SRAM cells to switch between a process tolerant mode in which the memory nodes of the SRAM cells are shared to form an effective single larger SRAM cell from the two or more SRAM cells and a high performance mode in which the two or more SRAM cells operate independently. In one example, a process tolerant mode increases the size of the effective SRAM cell and reduces the impact of any sensitivities and/or variations (e.g., process and/or environmental variations) of the SRAM cells. In one example, a process tolerant mode may be utilized at a low voltage operation of a device including an SRAM system of the present disclosure. In another example, a high performance mode maximizes the memory capacity of an SRAM system of the present disclosure. Such maximization may occur during a high voltage operation of a device including an SRAM system of the present disclosure.

In one aspect, the present disclosure may provide an SRAM device including any number of SRAM cells (e.g., in an array) that operate in either a process tolerant mode (e.g., two or more SRAM cells shared) or in a high performance mode (e.g., each SRAM cell operating independently) depending on a predetermined condition of the SRAM device. In one example, where an SRAM circuit operates in a process tolerant mode, an amount of memory capacity of an SRAM device is reduced in trade-off for stability (e.g., at low voltage operation).

Figure 6:
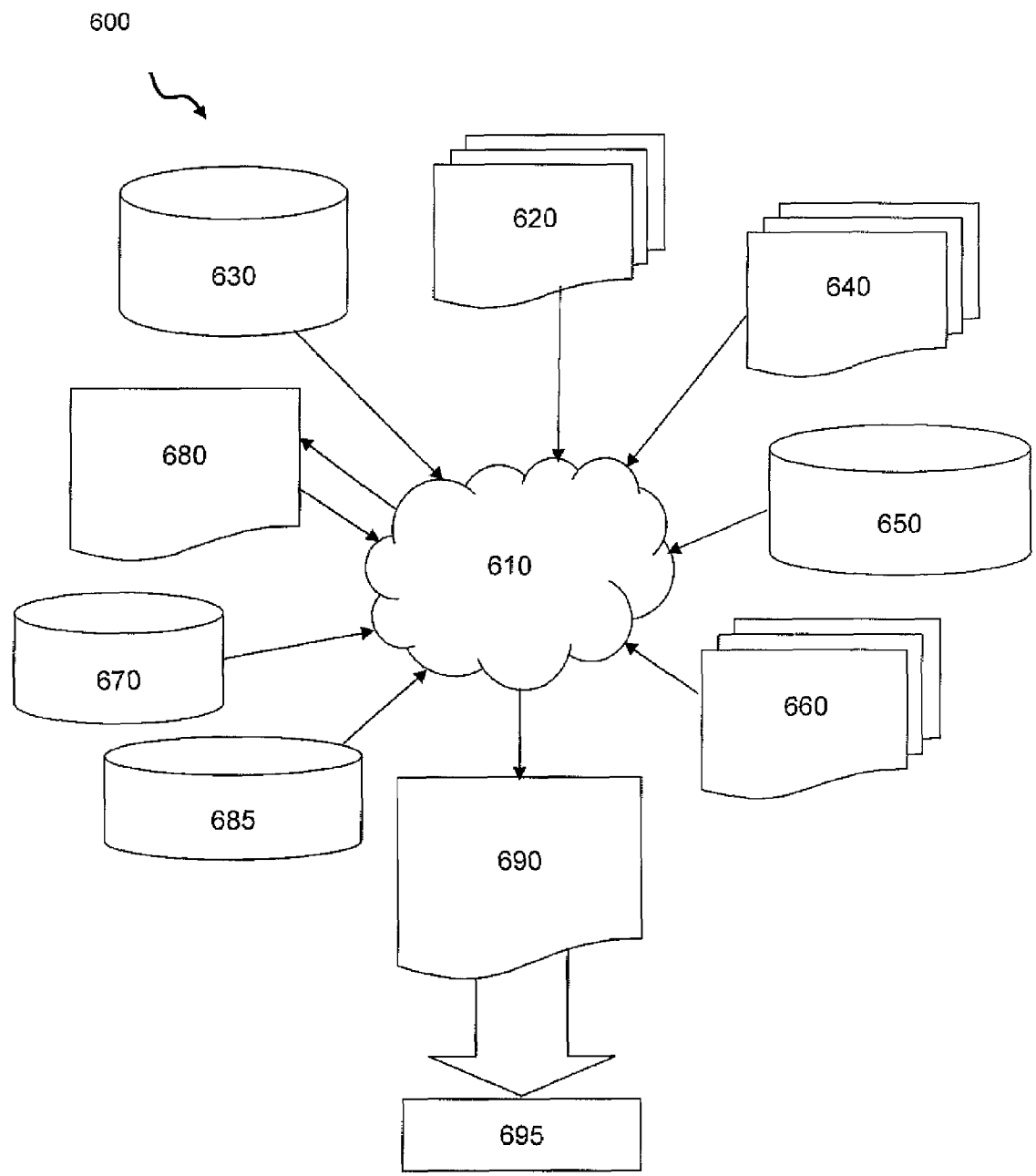
FIG. 6 is a flow diagram of a design process used in semiconductor design, manufacturing, and/or test.

FIG. 6 shows a block diagram of an example design flow 600. Design flow 600 may vary depending on the type of IC being designed. For example, a design flow 600 for building an application specific IC (ASIC) may differ from a design flow 600 for designing a standard component. Design structure 620 is preferably an input to a design process 610 and may come from an IP provider, a core developer, or other design company or may be generated by the operator of the design flow, or from other sources. Design structure 620 comprises circuit 100 in the form of schematics or HDL, a hardware-description language (e.g., Verilog, VHDL, C, etc.). Design structure 620 may be contained on one or more machine readable medium. For example, design structure 620 may be a text file or a graphical representation of circuit 100. Design process 610 preferably synthesizes (or translates) circuit 100 into a netlist 680, where netlist 680 is, for example, a list of wires, transistors, logic gates, control circuits, I/O, models, etc. that describes the connections to other elements and circuits in an integrated circuit design and recorded on at least one of machine readable medium. This may be an iterative process in which netlist 680 is resynthesized one or more times depending on design specifications and parameters for the circuit.

Design process 610 may include using a variety of inputs; for example, inputs from library elements 630 which may house a set of commonly used elements, circuits, and devices, including models, layouts, and symbolic representations, for a given manufacturing technology (e.g., different technology nodes, 32 nm, 45 nm, 90 nm, etc.), design specifications 640, characterization data 650, verification data 660, design rules 670, and test data files 685 (which may include test patterns and other testing information). Design process 610 may further include, for example, standard circuit design processes such as timing analysis, verification, design rule checking, place and route operations, etc. One of ordinary skill in the art of integrated circuit design can appreciate the extent of possible electronic design automation tools and applications used in design process 610 without deviating from the scope and spirit of the invention. The design structure of the invention is not limited to any specific design flow.

Design process 610 preferably translates an embodiment of the invention, e.g., as shown in FIGS. 1 and 5, along with any additional integrated circuit design or data (if applicable), into a second design structure 690. Design structure 690 resides on a storage medium in a data format used for the exchange of layout data of integrated circuits (e.g. information stored in a GDSII (GDS2), GL1, OASIS, or any other suitable format for storing such design structures). Design structure 690 may comprise information such as, for example, test data files, design content files, manufacturing data, layout parameters, wires, levels of metal, vias, shapes, data for routing through the manufacturing line, and any other data required by a semiconductor manufacturer to produce an embodiment of the invention, e.g., as shown in FIGS. 1 and 5. Design structure 690 may then proceed to a stage 695 where, for example, design structure 690: proceeds to tape-out, is released to manufacturing, is released to a mask house, is sent to another design house, is sent back to the customer, etc.

Exemplary embodiments have been disclosed above and illustrated in the accompanying drawings. It will be understood by those skilled in the art that various changes, omissions and additions may be made to that which is specifically disclosed herein without departing from the spirit and scope of the present invention.

What is claimed is:

1. A design structure embodied in a machine readable medium used in a design process for a static random access memory (SRAM) circuit, the design structure for the circuit comprising:
   a first SRAM cell having a first memory node and a second memory node;
   a second SRAM cell having a third memory node and a fourth memory node;
   a first cell control module connected between the first memory node and the third memory node; and
   a second cell control module connected between the second memory node and the fourth memory node, the first and second cell control modules configured to switch between a first mode of operation where the memory nodes of the first SRAM and the second SRAM are isolated and a second mode of operation where the first and third memory nodes are shared and the second and fourth memory nodes are shared,
      wherein the first SRAM cell is configured to be read from and/or written to independently of the second SRAM cell in the first mode of operation; and the first and second SRAM cells are configured to be read from and/or written to simultaneously in the second mode of operation.

2. The design structure of claim 1, wherein the design structure comprises a netlist, which describes the circuit.

3. The design structure of claim 1, wherein the design structure resides on storage medium as a data format used for the exchange of layout data of integrated circuits.

4. The design structure of claim 1, wherein the design structure includes at least one of test data files, characterization data, verification data, or design specifications.

5. The design structure of claim 1, wherein the design circuit for said SRAM circuit at least one of the first and second SRAM cells includes a cross-coupled six transistor SRAM cell.

6. A design structure embodied in a machine readable medium for a static random access memory (SRAM) circuit, the design structure for the circuit comprising:
   a first SRAM cell having a first plurality of memory nodes, the first SRAM cell coupled to a first bitline, a second bitline, and a first wordline;
   a second SRAM cell having a second plurality of memory nodes, the second SRAM cell being coupled to the first and second bitlines and a second wordline; and
   a pair of cell isolation devices connected between the first and second pluralities of memory nodes for switching between a first mode of operation where the first and second SRAM cells are combined to form a shared SRAM cell and a second mode of operation where the first and second SRAM cells are isolated from each other,
      wherein the first and second wordlines are configured to operate together in the first mode of operation and to operate separately in the second mode of operation.

* * * * *